United States Patent
Yokogawa et al.

[11] Patent Number: 6,126,864
[45] Date of Patent: Oct. 3, 2000

[54] CARBONACEOUS MATERIAL HAVING NOVEL ELECTRONIC STRUCTURE OF SURFACE AND METHOD FOR THE PREPARATION THEREOF

[75] Inventors: Kiyoshi Yokogawa; Seiji Fukuyama; Bai An, all of Kure; Masamichi Yoshimura, Nagoya; Isao Mochida, Fukuoka, all of Japan

[73] Assignee: Agency of Industrial Science and Technology, Japan

[21] Appl. No.: 09/046,649

[22] Filed: Mar. 24, 1998

[30] Foreign Application Priority Data

Mar. 28, 1997 [JP] Japan .................................. 9-094816

[51] Int. Cl.⁷ .................................................. H01B 1/04
[52] U.S. Cl. ..................... 252/502; 423/414; 423/445 R; 423/448; 423/460; 428/367; 428/408
[58] Field of Search ........................... 252/510; 423/599, 423/446, 447.1, 447.3, 447.7, 460, 448; 428/367; 117/118; 156/613; 427/39, 99, 113

[56] References Cited

U.S. PATENT DOCUMENTS 4,808,475  2/1989  Matsumura et al. ...................... 428/367
5,075,094  12/1991  Morrish et al. .......................... 423/446
5,209,812  5/1993  Wu et al. ................................. 156/613

*Primary Examiner*—Mark Kopec
*Assistant Examiner*—Derrick G Hamlin
*Attorney, Agent, or Firm*—Wenderoth, Lind & Ponack, L.L.P.

[57] ABSTRACT

A novel carbonaceous material having a unique periodical annular electronic surface structure as examined by means of a scanning tunnel microscopy can be obtained by the method comprising the steps of: (a) forming a layer of a carbonaceous material having a curved configuration by the method of vapor-phase deposition of a carbonaceous material; and (b) subjecting the vapor-phase deposited layer of the carbonaceous material to a heat treatment at a temperature of 1500 K or higher in a non-oxidizing atmosphere. The novel carbonaceous material is useful for carbon electrodes of various batteries.

3 Claims, 6 Drawing Sheets

(5 of 6 Drawing Sheet(s) Filed in Color)

6nm x 6nm

8nm x 8nm

8nm x 8nm

6nm x 6nm

4nm x 4nm

7nm x 7nm

CARBONACEOUS MATERIAL HAVING NOVEL ELECTRONIC STRUCTURE OF SURFACE AND METHOD FOR THE PREPARATION THEREOF

BACKGROUND OF THE INVENTION

The present invention relates to a novel carbonaceous material having a unique electronic structure of the surface as well as to a method for the preparation thereof.

The electronic structure of the open surfaces and cross sectional surfaces of a carbonaceous material was heretofore an important and interesting subject matter of investigations by using an optical microscope, scanning electron microscope or transmission electron microscope and carbonaceous materials having various surface structures have been discovered as a result of the investigations. Observation of the surface structure of carbonaceous materials in an atomic level, however, could not be undertaken before debut of a scanning tunnel microscope. As a result of the subsequent discovery of the regularly ordered electronic structure of the surface of a carbonaceous material by means of a scanning tunnel microscope, it is understood that conventional carbonaceous materials have a structure of graphite or a spotted structure something like a moiré pattern as a modulation of the graphite structure.

SUMMARY OF THE INVENTION

The object of the present invention is, in view of the above described knowledge on the structure of carbonaceous materials, to provide a novel carbonaceous material having, different from the conventional graphite structure or a spotted electronic structure like a moiré pattern as a modulation of the conventional graphite structure, a two-dimensional periodical annular electronic structure.

Thus, the present invention provides a novel carbonaceous material formed on the surface of a graphite as a substrate and having a two-dimensional periodical annular electronic surface structure having a symmetry of ($\sqrt{3}\times\sqrt{3}$)R30° relative to the crystalline structure of the base surface of the graphite substrate, of which the diameter is equal to that of a six-membered carbon ring.

The above defined novel and unique carbonaceous material is prepared by a method in which a carbonaceous material formed by vapor-phase deposition in a substantially curved configuration is subjected to a heat treatment at a temperature of 1500 K or higher in a non-oxidizing atmosphere.

BRIEF DESCRIPTION OF THE DRAWING

The file of this patent contains at least one drawing executed in color. Copies of this patent with color drawings will be provided by the Patent and Trademark Office upon request and payment of the necessary fee.

DETAILED DESCRIPTION OF THE PREFERRED EMBODIMENTS

In the above given definition of the inventive carbonaceous material, what is meant by the phrase of "symmetry of ($\sqrt{+e}$,fra 3+ee ×$\sqrt{3}$)R30° relative to the crystalline structure of the base surface of the graphite substrate" is that the surface electronic structure is larger by a factor of $\sqrt{3}$ and the orientation thereof is rotated rightwardly by 30° and what is meant by the "diameter of a six-membered carbon ring" possessed by the surface electronic structure is that the diameter of the curved part of the periodical annular electronic structure is equal to the diameter of a six-membered carbon ring structure.

In the following, the novel carbonaceous material of the invention is described in detail by making reference to the accompanying drawing.

Figure 1:
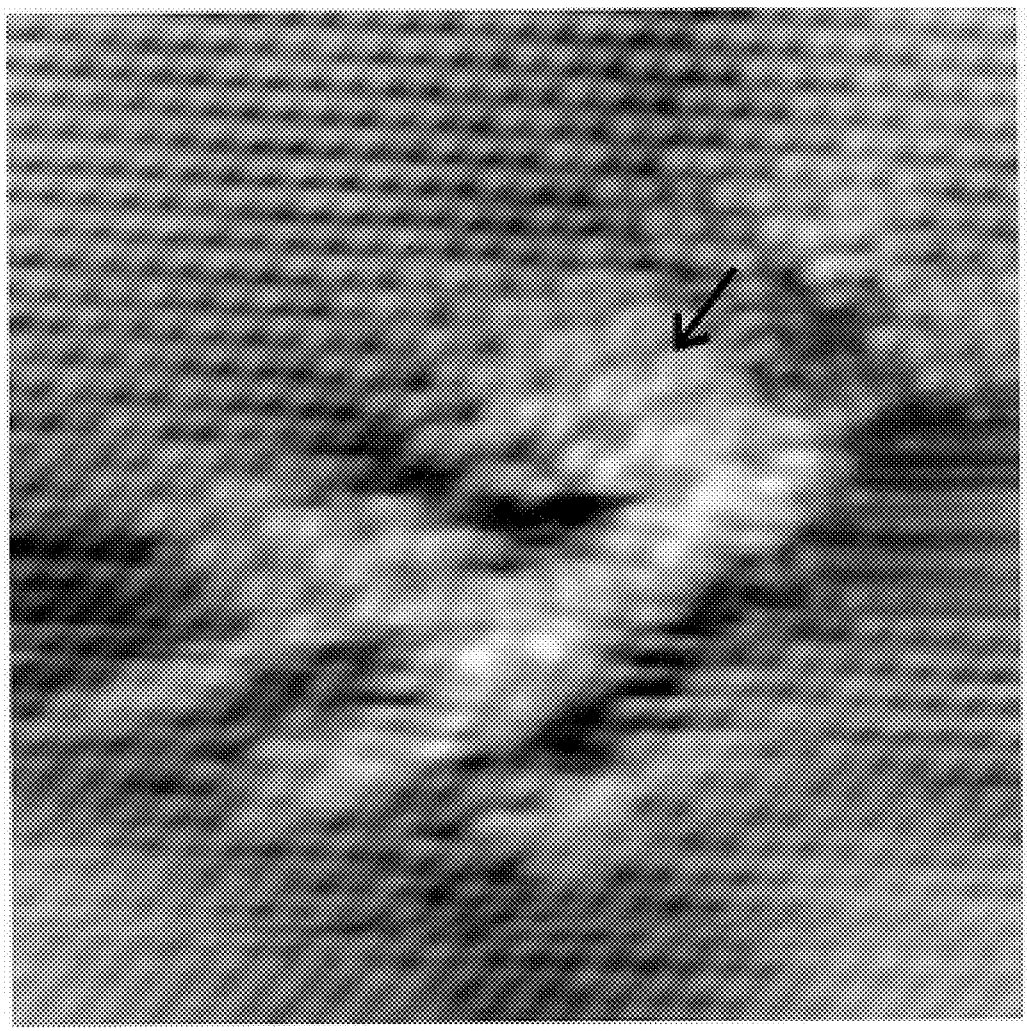
FIG. 1 is a scanning tunnel microscopic photograph showing an annular electronic structure of a carbonaceous material.

FIG. 1 of the accompanying drawing is a scanning tunnel microscopic photograph showing the electronic structure of the inventive carbonaceous material, in which the annular structure indicated by the arrow is the inventive carbonaceous material while the spot-like periodical structure around the same is conventional graphite.

Besides the above mentioned annular form of the electronic structure shown in FIG. 1, the inventive carbonaceous material can be in the form of a horseshoe or a pair of brackets, in each of which the diameter of curvature is equal to the diameter of the six-membered carbon ring structure.

Figure 2A:
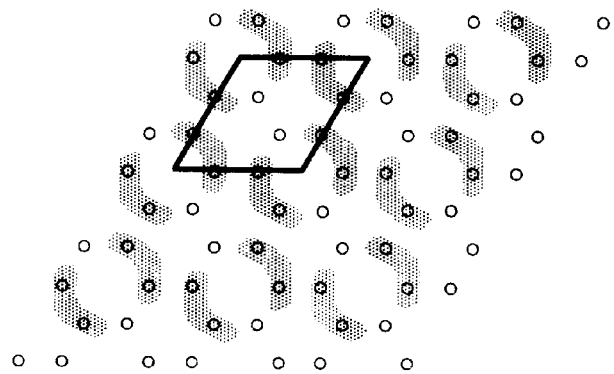
FIGS. 2A, 2B and 2C are each a model illustration showing the relationship between the annular electronic structure of the inventive carbonaceous material and the six-membered carbon ring structure.
Figure 2B:
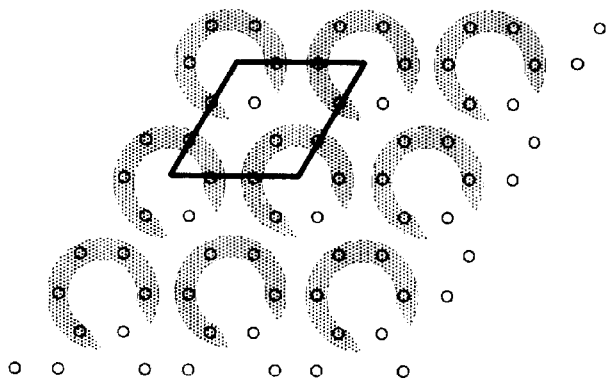
Figure 2C:
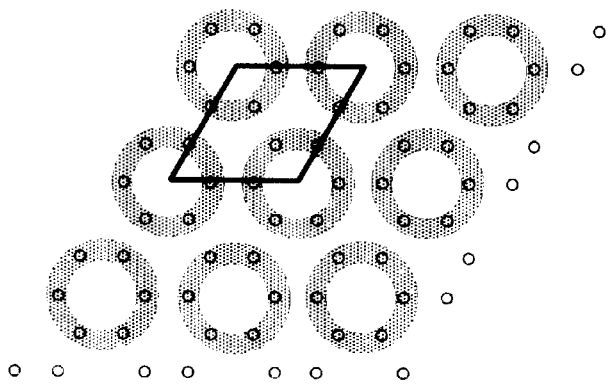

FIGS. 2A, 2B and 2C are each a schematic illustration of these electronic structures, of which FIG. 2C is for an annular form, FIG. 2B is for a horseshoe form and FIG. 2A is for the form of a pair of brackets.

A physical model is proposed for the spot-like periodical structure of a conventional graphite material, which well explains appearance of the spot-like electronic structure caused by the wave interference of the electrons in the β-site atoms. Since the electronic structure of the invention cannot be fully explained by this physical model, the inventors have proposed a new physical model which explains appearance of the electronic structure with an assumption that not only the β-sites but also the α-sites pertain to the wave interference along with a combination thereof equally pertaining thereto.

Figure 3A:
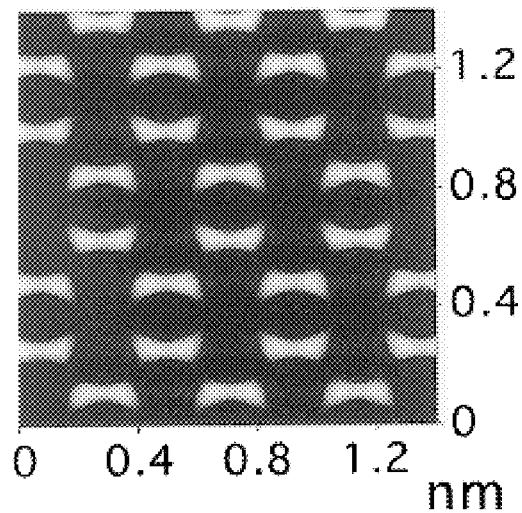
FIGS. 3A, 3B, 3C and 3D are each a computer-simulation pattern by means of a wave-interference model according to the invention.
Figure 3B:
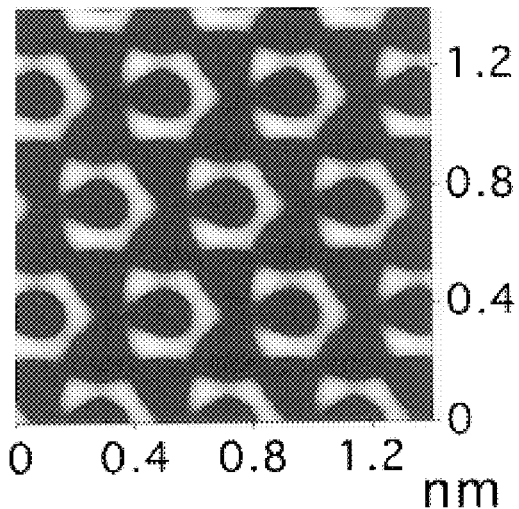
Figure 3C:
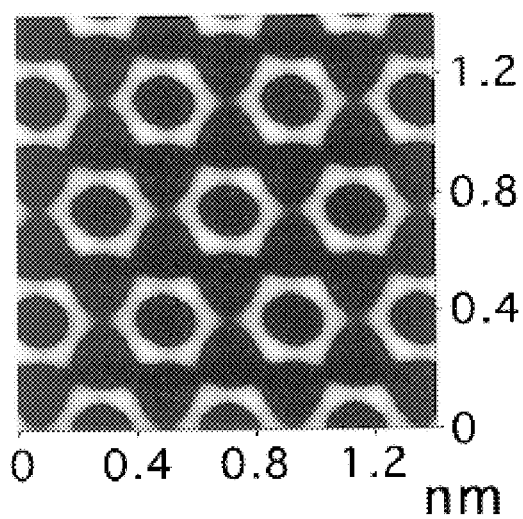
Figure 3D:
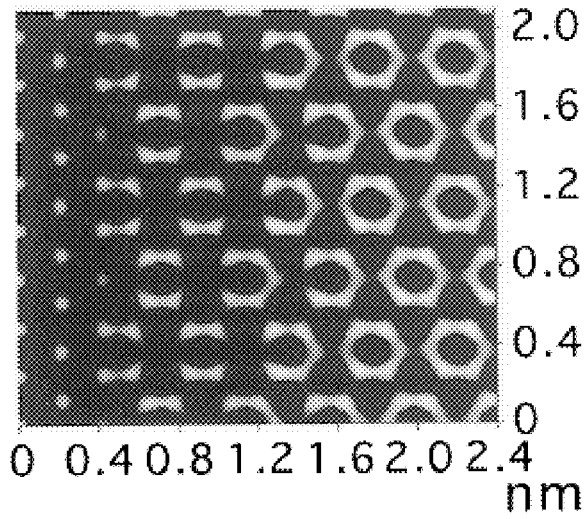

On the base of this new physical model, a computer simulation was undertaken to obtain good coincidence with the results of the observation. FIGS. 3A to 3D are each a computer simulation pattern obtained by the calculation on the base of this new wave interference model, of which FIGS. 3A, 3B and 3C correspond to the bracket form, horseshoe form and circular form, respectively, while FIG. 3D is a computer simulation pattern obtained by the calculation of transition from the graphite structure to the annular structure which indicates the changing process of the electronic structure as a result of the change in the parameters of the model.

The novel carbonaceous material having the above described unique surface electronic structure can be prepared by subjecting a carbonaceous material deposited from vapor phase onto a substrate surface to have a curved configuration to a heat treatment at a temperature of 1500 K or higher to effect graphitization thereof.

The above mentioned vapor-phase deposited layer of a carbonaceous material having a curved surface can be obtained by conducting vapor-phase deposition of carbon onto a substrate having a substantially curved surface according to a conventional vapor-phase deposition method. The surface of the layer of the carbonaceous material as just vapor-phase deposited does not exhibit any periodical electronic structure. When such a vapor-phase deposited carbon layer is subjected to a heat treatment at a temperature of 1500 K or higher or, preferably, in the range from 1550 K to 2800 K, a periodical annular electronic structure is formed. When the temperature of the heat treatment is lower than 1500 K, the periodical annular electronic structure characteristic in the invention can never be formed while, when the temperature is too high, vapor-phase dissipation of the carbonaceous material per se proceeds to destroy the electronic structure of the surface. As a general trend, the temperature of the heat treatment for the formation of the periodical annular electronic structure should be higher as the amount of the vapor-phase deposition of carbon is increased. The length of time for the heat treatment is selected in the range from 5 minutes to 20 minutes.

The carbonaceous material to serve as the starting material for the vapor-phase deposition is not particularly limitative and can be selected from carbonaceous materials of any kinds.

The carbonaceous material of the invention having the above described unique electronic surface structure is a novel material not described in any literatures. The carbonaceous material of the invention is useful as a material of carbon electrodes in various kinds of batteries by virtue of the larger electron density on the surface as compared with conventional graphite electrodes contributing to an increase of the current density on the electrode surface.

In the following, Examples are given to illustrate the present invention in more detail.

EXAMPLE 1

Figure 4A:
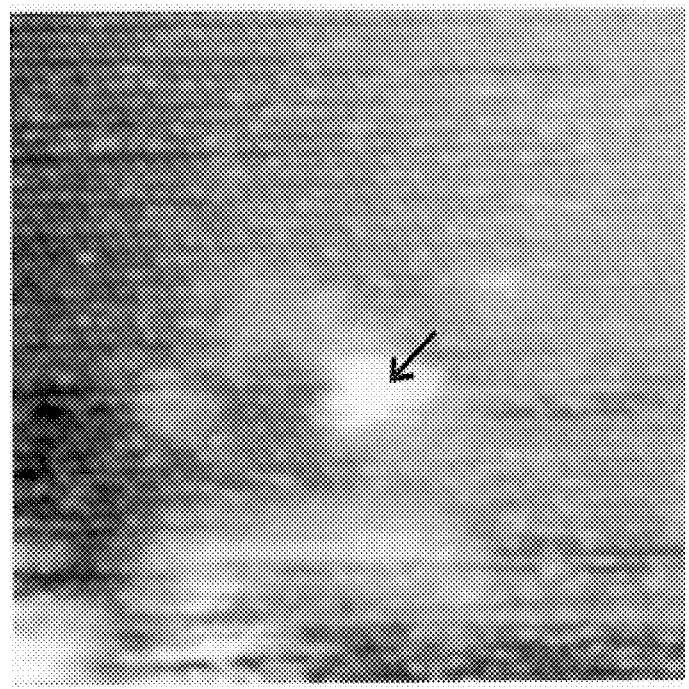
FIGS. 4A and 4B are each a scanning tunnel microscopic photograph of the carbonaceous material in Example 1 immediately after vapor-phase deposition.
Figure 4B:
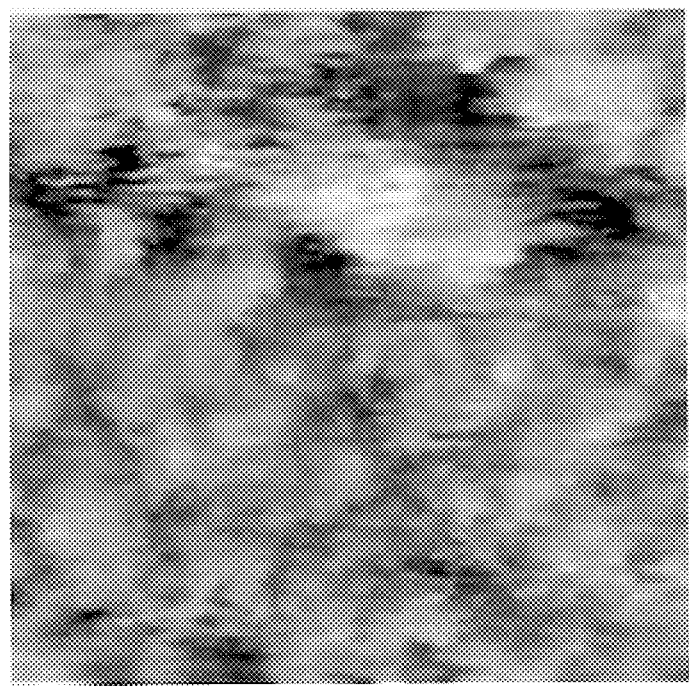

Vapor-phase deposition of carbon was performed on the surface of a graphite substrate to obtain a curved vapor-phase deposited carbon layer in a small amount or to obtain a vapor-phase deposited carbon layer allover, respectively. FIGS. 4A and 4B are each a scanning tunnel microscopic photograph of the thus obtained curved surface and allover-deposited surface. As is understood from these photographs, the deposited layer of curved configuration is sporadically distributed in spots as is indicated by the arrow in FIG. 4A and each spot is surrounded by the graphite as the substrate with a spot-like period. On the other hand, the photograph of FIG. 4B shows that the surface of the graphite substrate is covered allover by the vapor-phase deposited carbon.

In the next place, the thus formed vapor-phase deposited carbon layer on the substrate surface is subjected to a heat treatment in vacuum to effect graphitization of the carbon until appearance of a periodical annular electronic structure.

Figure 5A:
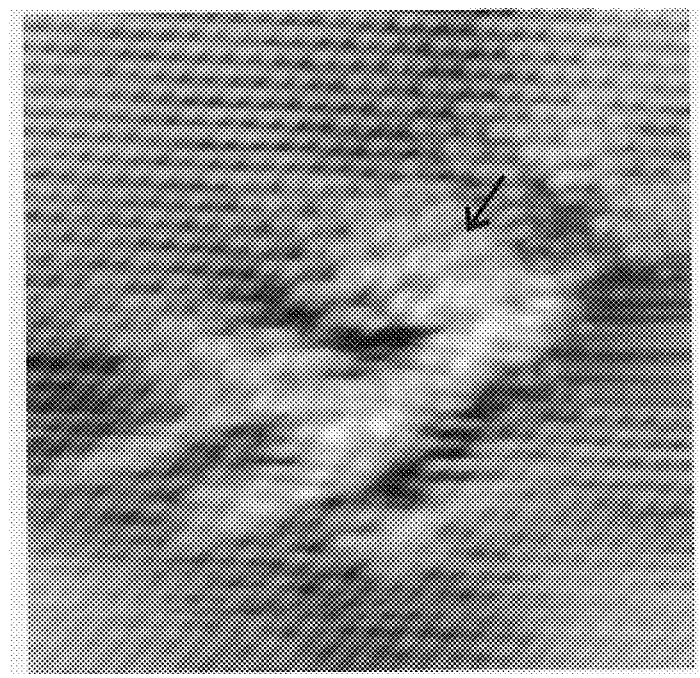
FIGS. 5A and 5B are each a scanning tunnel microscopic photograph of the carbonaceous material in Example 1 after the heat treatment.
Figure 5B:
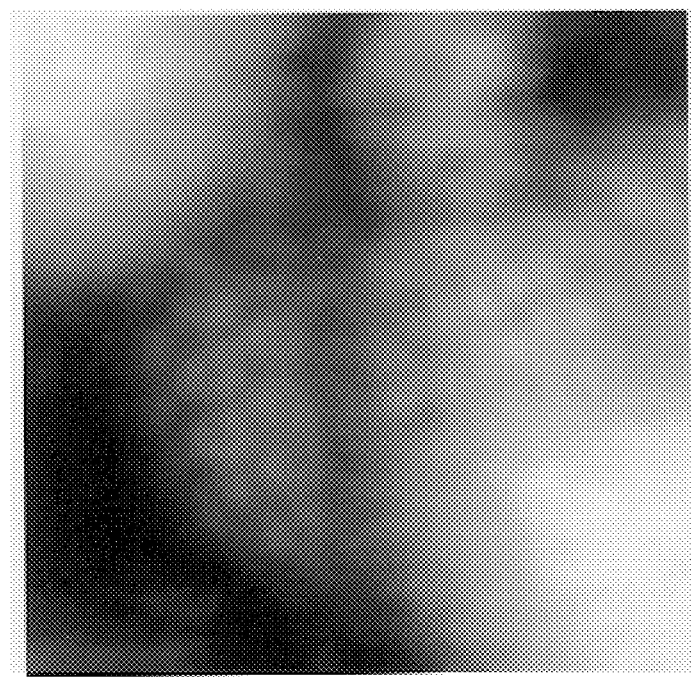

FIGS. 5A and 5B are each a scanning tunnel microscopic photograph of the thus graphitized carbon surface, of which the photograph of FIG. 5A was obtained by the heat treatment of the vapor-phase deposited carbon layer shown in FIG. 4A with a small amount of deposited carbon at a temperature of 1593 K for 10 minutes while the carbon layer shown in FIG. 5B exhibited a periodical annular electronic structure only after a heat treatment at 1643 K for 10 minutes.

EXAMPLE 2

Nanotubes of carbon were formed on a tubular substrate of graphite by the electric discharge method followed by a heat treatment at 1590 K for 10 minutes.

Figure 6:
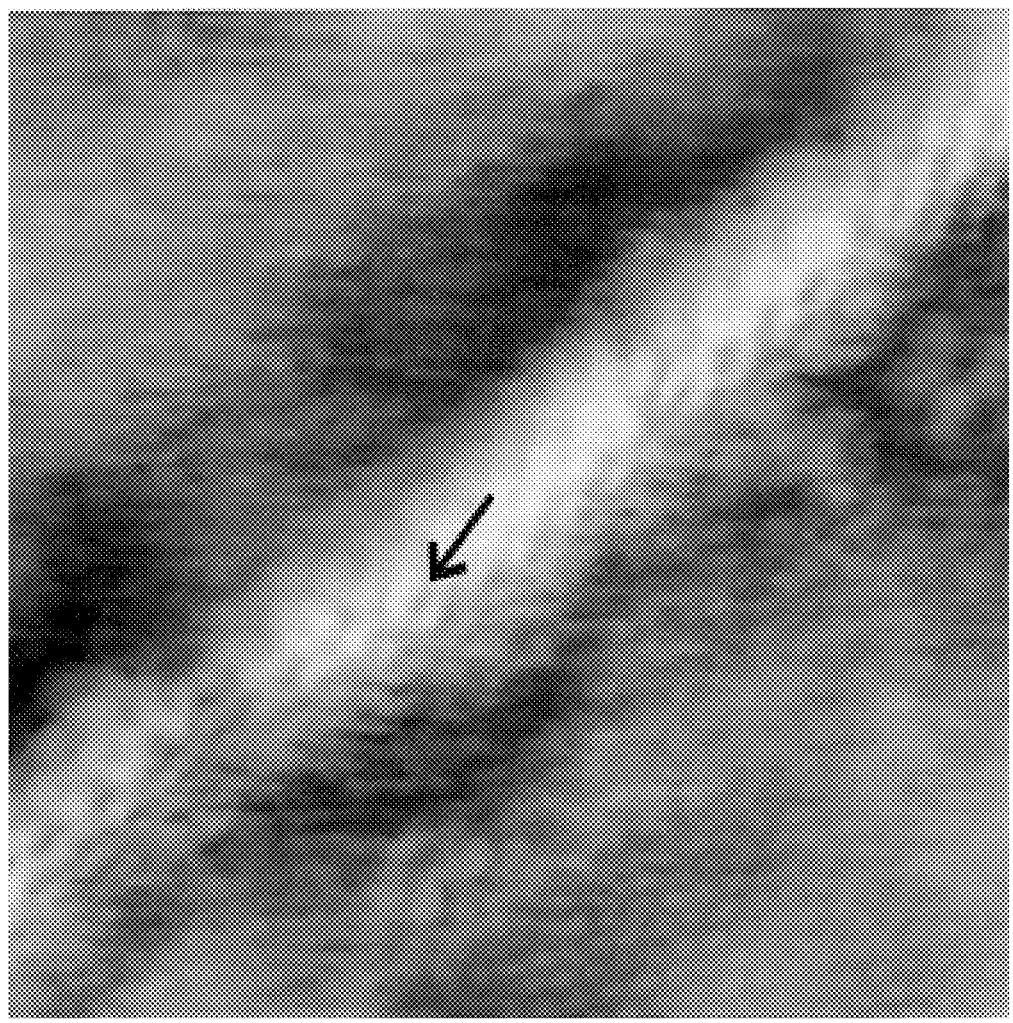
FIG. 6 is a scanning tunnel microscopic photograph of the carbonaceous material obtained in Example 2.

FIG. 6 is a scanning tunnel microscopic photograph of the thus obtained carbonaceous material, which clearly exhibits a periodical annular electronic structure.

What is claimed is:

1. A method for the preparation of a carbonaceous material formed on the surface of a graphite as a substrate and having a two-dimensional periodical annular electronic surface structure having a symmetry of ($\sqrt{3}\times\sqrt{3}$)R30° relative to the crystalline structure of the base surface of the graphite substrate, which comprises the steps of:

(a) forming a layer of a carbonaceous material having a curved configuration by the method of vapor-phase deposition of a carbonaceous material; and (b) subjecting the vapor-phase deposited layer of the carbonaceous material to a heat treatment at a temperature of 1500 K or higher in a non-oxidizing atmosphere.

2. The method as claimed in claim 1 in which the temperature of the heat treatment in step (b) is in the range from 1550 K to 2800 K.

3. The method as claimed in claim 1 in which the length of time for the heat treatment in step (b) is in the range from 5 minutes to 20 minutes.

* * * * *

UNITED STATES PATENT AND TRADEMARK OFFICE
CERTIFICATE OF CORRECTION

PATENT NO. : 6,126,864
DATED : October 3, 2000
INVENTOR(S) : Kiyoshi Yokogawa et al.

It is certified that error appears in the above-identified patent and that said Letters Patent is hereby corrected as shown below:

Title page,
The Assignee should read:

-- [73] Assignee: Japan as represented by Director General Of Agency of Industrial Science and Technology, Japan --.

Column 4, claim 1,
Line 9, after "material" insert -- onto a graphite substrate having a substantially curved surface --.

Signed and Sealed this

Thirteenth Day of November, 2001

Attest:

NICHOLAS P. GODICI
Attesting Officer  Acting Director of the United States Patent and Trademark Office